(12) United States Patent
Shu et al.

(10) Patent No.: US 11,380,517 B2
(45) Date of Patent: Jul. 5, 2022

(54) SYSTEM AND METHOD FOR SPATIALLY RESOLVED OPTICAL METROLOGY OF AN ION BEAM

(71) Applicant: APPLIED Materials, Inc., Santa Clara, CA (US)

(72) Inventors: Gang Shu, Hillsboro, OR (US); Glen Gilchrist, Danvers, MA (US); Shurong Liang, Lynnfield, MA (US)

(73) Assignee: APPLIED Materials, Inc., Santa Clara, CA (US)

( * ) Notice: Subject to any disclaimer, the term of this patent is extended or adjusted under 35 U.S.C. 154(b) by 239 days.

(21) Appl. No.: 16/870,622

(22) Filed: May 8, 2020

(65) Prior Publication Data

US 2020/0273661 A1    Aug. 27, 2020

Related U.S. Application Data

(63) Continuation of application No. 16/185,984, filed on Nov. 9, 2018, now Pat. No. 10,699,871.

(51) Int. Cl.
*H01J 37/22* (2006.01)
*H01J 37/244* (2006.01)
(Continued)

(52) U.S. Cl.
CPC ............ *H01J 37/226* (2013.01); *H01J 37/08* (2013.01); *H01J 37/244* (2013.01);
(Continued)

(58) Field of Classification Search
CPC ........ H01J 37/226; H01J 37/08; H01J 37/244; H01J 37/3005; H01J 2237/2445;
(Continued)

(56) References Cited

U.S. PATENT DOCUMENTS 6,326,631 B1    12/2001    Politiek et al.
6,573,517 B1    6/2003    Sugitani et al.
(Continued)

FOREIGN PATENT DOCUMENTS

JP    2013211177 A    10/2013
KR    1020160062978 A    6/2016

OTHER PUBLICATIONS

International Search Report dated Feb. 20, 2020, from PCT/US2019/059050 filed Oct. 31, 2019, 3 pages.
(Continued)

*Primary Examiner* — Seung C Sohn
(74) *Attorney, Agent, or Firm* — KDB Firm PLLC

(57) ABSTRACT

Provided herein are systems and methods for spatially resolved optical metrology of an ion beam. In some embodiments, a system includes a chamber containing a plasma/ion source operable to deliver an ion beam to a wafer, and an optical collection module operable with the chamber,
(Continued)

wherein the optical collection module includes an optical device for measuring a light signal from a volume of the ion beam. The system may further include a detection module operable with the optical collection module, the detection module comprising a detector for receiving the measured light signal and outputting an electric signal corresponding to the measured light signal, thus corresponding to the property of the sampled plasma volume.

20 Claims, 7 Drawing Sheets

(51) Int. Cl.
    *H01J 37/08*     (2006.01)
    *H01L 21/67*     (2006.01)
    *H01J 37/30*     (2006.01)

(52) U.S. Cl.
    CPC .... *H01J 37/3005* (2013.01); *H01L 21/67069* (2013.01); *H01L 21/67253* (2013.01); *H01J 2237/2445* (2013.01); *H01J 2237/24578* (2013.01)

(58) Field of Classification Search
    CPC ... H01J 2237/24578; H01J 2237/24528; H01J 2237/24542; H01J 2237/2482; H01J 2237/30472; H01L 21/67069; H01L 21/67253

See application file for complete search history.

(56) References Cited

U.S. PATENT DOCUMENTS

| | | | |
|---|---|---|---|
| 6,716,727 | B2 | 4/2004 | Walther |
| 7,078,712 | B2* | 7/2006 | Perel ................. G01N 21/47 |
| | | | 250/492.1 |
| 7,235,795 | B2* | 6/2007 | Simmons ............ H01J 37/3171 |
| | | | 250/397 |
| 7,326,941 | B2 | 2/2008 | Chen et al. |
| 7,723,697 | B2 | 5/2010 | Perel et al. |
| 7,888,653 | B2 | 2/2011 | Kellerman et al. |
| 2005/0191409 | A1 | 9/2005 | Murrell et al. |
| 2012/0068081 | A1 | 3/2012 | Chang et al. |
| 2017/0140905 | A1 | 5/2017 | Mihaylov et al. |
| 2018/0068828 | A1 | 3/2018 | Halling |

OTHER PUBLICATIONS

Written Opinion dated Feb. 20, 2020, from PCT/US2019/059050 filed Oct. 31, 2019, 5 pages.

* cited by examiner

SYSTEM AND METHOD FOR SPATIALLY RESOLVED OPTICAL METROLOGY OF AN ION BEAM

CROSS-REFERENCE TO RELATED APPLICATION

This application is a continuation of U.S. Non-Provisional patent application Ser. No. 16/185,984 filed on Nov. 9, 2018, entitled "SYSTEM AND METHOD FOR SPATIALLY RESOLVED OPTICAL METROLOGY OF AN ION BEAM," and incorporated by reference herein in its entirety.

FIELD OF THE DISCLOSURE

The present embodiments relate to semiconductor device surface treatments, and more particularly, to systems and methods for spatially resolved optical metrology of an ion beam.

BACKGROUND OF THE DISCLOSURE

Plasma etchers utilize directed ribbon ion beams to achieve complex etching and surface processing, thus solving many challenges in the fabrication of most advanced 3D semiconductor structures. Characterization of the ion beam, monitoring process end-points, and advanced plasma probing are relevant metrologies necessary for implanter operations. Currently, the metrologies are achieved with different mechanisms, such as Faraday cup arrays and free space optical emission spectrum (OES). These approaches have their limits and disadvantages. For example, the Faraday cup array is an in-chamber metrology device. As a result, the Faraday cup array presentation brings in extra particles and metals. Furthermore, patch charges accumulated on the shield of the Faraday cup array may also perturb the beam path and give results deviating from the actual values. The free space OES is widely adopted in process endpoint control, yet cannot resolve the ion beam's spatial distribution, and may suffer from various optical noises from the environment and from different materials in the etching beam.

The present disclosure addresses at least the above identified deficiencies of the prior art.

SUMMARY OF THE DISCLOSURE

The Summary of the Disclosure is provided to introduce a selection of concepts in a simplified form. The Summary of the Disclosure is not intended to identify key features or essential features of the claimed subject matter, nor intended as an aid in determining the scope of the claimed subject matter.

In an example embodiment, a system may include a chamber containing an ion source operable to deliver an ion beam to a wafer, and an optical collection module operable with the chamber, wherein the optical collection module includes an optical device for measuring a light signal of a volume of the ion beam. The system may further include a detection module operable with the optical collection module, the detection module comprising a detector for receiving the measured light signal and outputting an electric signal corresponding to the sampled volume of the ion beam.

In another example embodiment, a system for spatially resolved optical metrology of an ion beam may include a chamber containing an ion source operable to deliver an ion beam to a wafer, wherein the ion beam is a ribbon ion beam. The system may further include an optical collection module operable with the chamber, the optical collection module including an optical device, and a first plate adjacent the optical device, the first plate having a first aperture for receiving a sample of the ion beam. The optical collection module may further include a second plate adjacent the first plate, the second plate having a second aperture for receiving a light signal measured from a sample of the ion beam from the first plate. The system may further include a detection module operable with the optical collection module, the detection module comprising a detector operable to receive the light through second plate, and output an electric signal corresponding to the sample of the ion beam.

In another example embodiment, a method may include providing a chamber containing an ion source delivering an ion beam to a wafer, and measuring a light signal of a portion of the ion beam using an optical collection module operable with the chamber. The optical collection module may include an optical device adjacent the chamber, and a first plate adjacent the optical device, the first plate having a first aperture receiving the light signal. The optical collection module may further include a second plate adjacent the first plate, the second plate having a second aperture receiving the light signal through the first plate. The method may further include receiving the light signal at a detection module, and outputting an electric signal from the detection module, the electric signal corresponding to the measured light signal.

Figure 1:
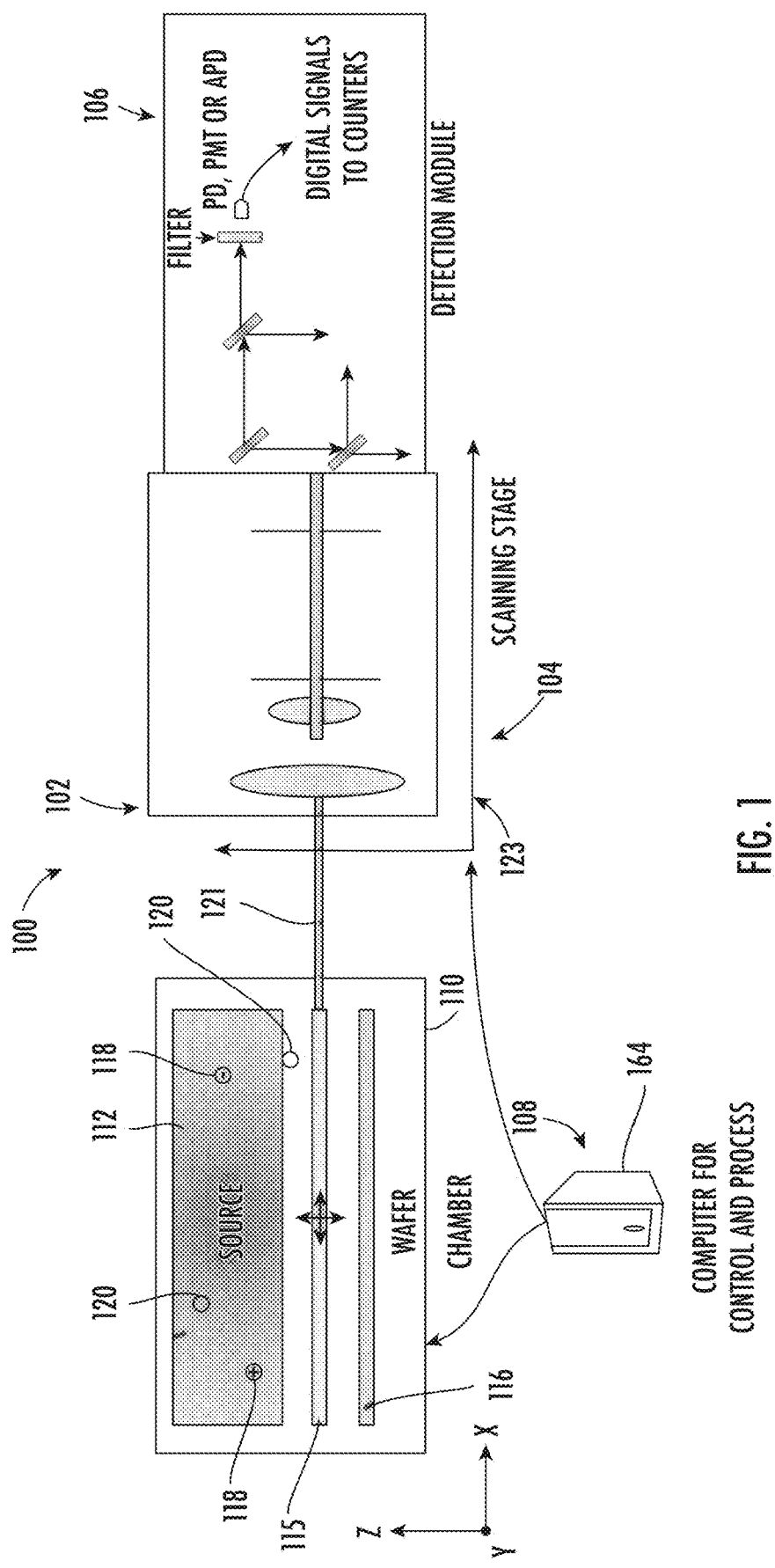
FIG. 1 is a diagram of a system for spatially resolved optical metrology of an ion beam, in accordance with embodiments of the present disclosure.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Systems and methods in accordance with the present disclosure will now be described more fully hereinafter with reference to the accompanying drawings, where embodiments of the methods are shown. The systems and methods may be embodied in many different forms and are not to be construed as being limited to the embodiments set forth herein. Instead, these embodiments are provided so the disclosure will be thorough and complete, and will fully convey the scope of the system and method to those skilled in the art.

As further described herein, provided is a spatial resolved optical system and method of using, the system including a precisely controlled scanning mechanism and a high sensitivity detection scheme to achieve non-invasive beam metrology, and to improve endpoint control. The embodiments herein provide a comprehensive solution for multiple problems without the current disadvantages of the prior art described above.

In some embodiments, during an etching process, optical signals can be generated from spontaneous emissions from excited ions and neutrals. The ions are mainly from the plasma source. The neutrals may come from the etchant gases, etch products, and sputtered material from wafer surface and chamber surfaces. By selecting the wavelength as appropriate, these components may be monitored separately for different purposes. When spatially resolved and correlated with scanning position, these optical signal intensities can reveal various distributions.

In some embodiments, spatial resolution may be achieved by optical filtering and precision mechanical scanning. The capacity allows fine resolve of plasma/neutral distribution by detected signature optical signals. The approach provides a non-invasive beam metrology method providing similar or better performance than current Faraday cup array solutions, yet without the disadvantage of in-vacuum contaminations. Approaches herein can be used to improve signal noise ratio in various OES applications, and to resolve material/beam exposure distribution on the wafer and chamber surface. A setup with additional narrow band light source illuminating the plasma area is suitable for absorption spectroscopy used to selectively detect certain components in the ion beam by their spectrum lines.

With the embodiments herein, multiple band/wavelengths can be monitored and correlated for various applications. For example, the correlation of the attenuation of one signal with the intensification of the other may be used for endpoint control in process. To further increase the optical signal's intensity, other methods can be used, namely, adding an inert gas with known spectral signature to the plasma source. The inert gas increases the strength of the optical signal around the ion ribbon beam, and emerges the ion beam in a higher neutral pressure. The higher pressure of the inert gas increases the collision between ions and neutrals, thus increasing the light intensity.

Although non-limiting, at least the following applications may benefit from the systems and methods of the present disclosure. In a first application, the high spatial resolution and high sensitivity of the systems and methods herein offer a noninvasive beam metrology method to resolve beam angle, spreading and evenness. The high spatial resolution can be used to distinguish different material/beam-exposure on wafer and chamber surfaces. The capacity is useful for some metrology schemes.

In a second application, systems and methods herein may increase the signal noise ratio for OES applications. The approaches herein focus on the optical signal from a small plasma slice, filtering out lights from the environment, source glowing, IR heating scattering, etc., thus providing a more relevant and accurate optical signal for process monitoring and control.

In a third application, the systems and methods herein offer the potential for more advanced plasma metrology, as a well confined collection angle is suitable for absorption spectroscopy. With narrow band coherent sources, certain components of the ion beam can be selectively detected. Other optical techniques, such as modulating of excitation and photon correlation, can be used to reduce noise and retrieve more plasma optical properties.

In a fourth application, the systems and methods herein offer an alternative detection scheme to address the relatively weak signal. For example, a no-loss dichroic mirror system may be used to divide the original emission into multiple bands with little loss, further filtered with narrow or broad band filters. The selectivity of the optical signal is mapped into the selectivity of the materials and particle species. Multiple signals can be correlated to make better decisions on processing endpoints. Methods herein may achieve a much higher sensitivity than spectrum meter in the current OES system with either high sensitivity photo diodes, or low noise photo multiply tubes, while also greatly cutting the bandwidth necessary for data communication and the storage size for data logging.

Turning now to FIG. 1, a system 100 for spatially resolved optical metrology of an ion beam according to various embodiments of the disclosure will be described. As shown, the system 100 include an interworking group of modules, such as an optical collection module 102, a scanning module 104, a detection module 106, and a control module 108. The optical collection module 102 operates with a chamber 110 containing an ion source 112 configured to deliver an ion beam 115 to a wafer 116. The ion beam 115 may be extracted through an extraction aperture (not shown) as a ribbon ion beam having a beam width greater than a beam height.

During use, ions 118 may be in excited states and emit photons when passing the gap between the ion optics and the wafer 116. The ions 118 may impact a surface 117 of the wafer 116 and excite sputtered atoms/molecules, wherein the latter may emit photons. Ions may recombine with electrons and emit photons in relatively rare situations, since there are very few electrons in the ion beam 115.

Neutral gas molecules 120 may be present in many locations within the chamber 110, and radicals may emit photons when passing the gap. The ions 118 may collide with the neutral gas molecules 120 and excite the neutral gas molecules 120 to emit photons. In some cases, the collision probability is >0.1. In some embodiments, an additional inert gas can be added to ion source 112 as a signal enhancer.

As shown, the optical collection module 102 may include, or be mounted on, a mechanical device 123. The mechanical device may be a moveable platform operable to scan the optical collection module 102 in multiple directions. For example, the mechanical device 123 has the capacity to scan in x and/or y and/or z directions. The precise coordinates for the mechanical device 123 can be set and read by the control module 108.

Figure 2:
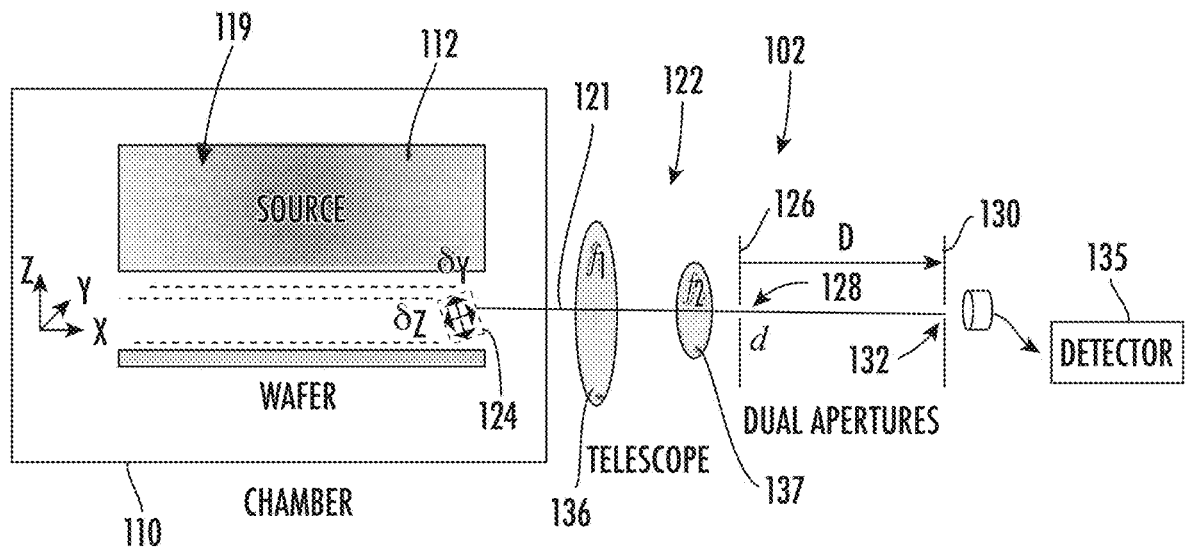
FIG. 2 is a diagram of an optical collection module of the system of FIG. 1, in accordance with embodiments of the present disclosure.

Turning now to FIG. 2, the optical collection module 102 according to embodiments of the present disclosure will be described in greater detail. As shown, the optical collection module 102 is operable with the chamber 110 and may include an optical device 122 for measuring one or more light signals 121 of a volume, sample, or portion 124 of the ion beam 115. In some embodiments, the optical device 122 is a telescope or equivalent optics. The optical collection module 102 may further include a first plate 126 having a first aperture 128 receiving the portion 124 of the ion beam 115. The optical collection module 102 may further include a second plate 130 having a second aperture 132 receiving the portion 124 of the ion beam 115 from the first plate 126. The optical signal representing the portion 124 of the ion beam 115 may then be transmitted to a detector 135 of the detection module 106.

The optical collection module 102 may measure the light signals 121 instead of directly measuring a plasma 119, the existing method of beam profiling. The light signals 121 are generated by a small resolved volume of the plasma 119. Thus, when the light signals 121 are measured, properties of the sampled plasma 119 volume may be determined indirectly. As will be described in greater detail below, the light signals 121 may be measured by the detector 135, such as a photomultiplier tube (PMT), a photo diode, or a charge-coupled device (CCD). In non-limiting embodiments, the optical collection module 102 achieves spatial resolution in the y-z directions shown. The optical device 122 may include a first convex lens 136 and a second convex lens 137, wherein $f_1$ and $f_2$ represent the effective focal length of the respective lenses 136, 137. The first and second apertures 128 and 132 accepts a narrow angle, and the telescope 122 further reduce the angle to:

$$\phi = \frac{d}{D} \frac{f_2}{f_1},$$

and y-z resolution is determined as $\delta_{yz} = g\phi$, where g is the distance between the plasma source and the first convex lens 136. In FIG. 2, $\delta_y$, $\delta_z$ represents the resolution in y and z directions.

Figure 3:
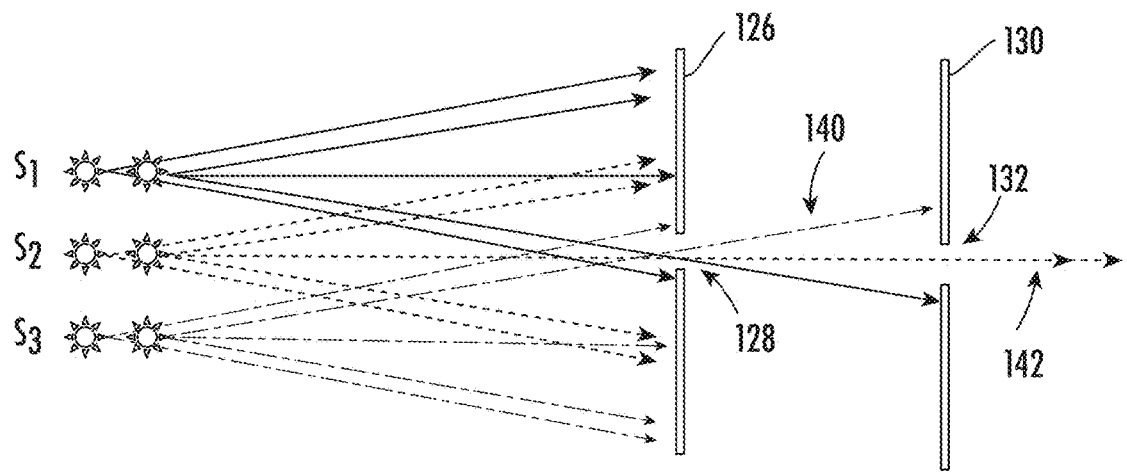
FIG. 3 demonstrates operation of a set of aperture plates of the optical collection module of FIG. 2, in accordance with embodiments of the present disclosure.

Turning now to FIG. 3, spatial resolution in the y-z directions achieved by the dual-aperture configuration of the first and second plates 126, 130 according to embodiments of the present disclosure will be described in greater detail. As shown, without the first plate 126 and the first aperture 128, light from multiple sources S1, S2, S3 will illuminate the same area, thus resulting in no spatial resolution. With the first aperture 128 alone, a portion 140 of light from adjacent sources will still leak into the detection, thus increase the detection noise. When the first aperture 128 is combined with the second aperture 132, the second plate 130 reject lights from adjacent sources, and accepts light 142 just from the sources (e.g., S2) along an axis extending through the first and second apertures 128, 132.

In one non-limiting example, using practical dimensions of d=0.5 mm, D=50 mm, $$\frac{f_2}{f_1} = 0.2,$$

$\phi = 2 \times 10^{-3}$, the corresponding spatial resolution is 0.5 m $\times \phi = 1 \times 10^{-3}$ m=1 mm. In some examples, higher resolution can be achieved with smaller apertures and a larger telescope magnification.

Figure 4:
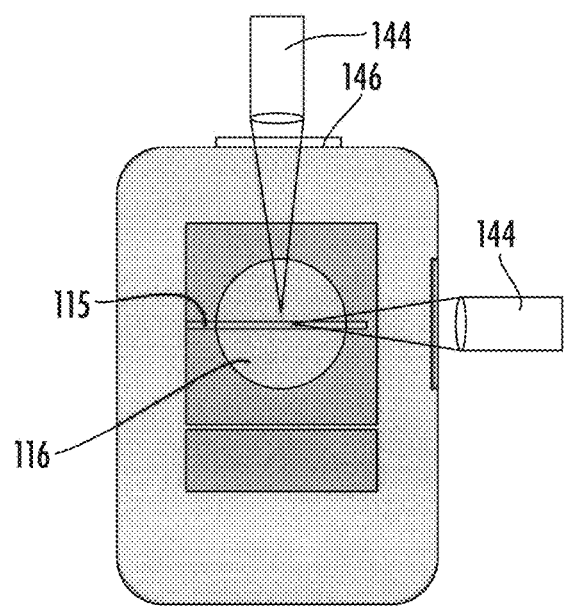
FIG. 4 depicts an arrangement of two imaging devices for sampling a horizontal and a cross-section of the ion beam, in accordance with embodiments of the present disclosure.

As shown in FIG. 4, to measure a beam evenness of the ion beam 115, the system 100 may further include one or more imaging devices 144 operable to generate an image of the ion beam 115 as the ion beam 115 scans the wafer 116. In some embodiments, the imaging devices 144 include a highly sensitive camera with suitable filter placed above a top window 146 of the chamber 110 for directly imaging the ion beam 115. The image corresponds to the beam distribution of the ion beam 115 across the x direction, and can be used as a measurement of ion beam evenness along the x direction. In some embodiments, the different collection directions from the multiple imaging devices 144 may resolve all x, y, z dimensions of the ion beam.

Figure 5:
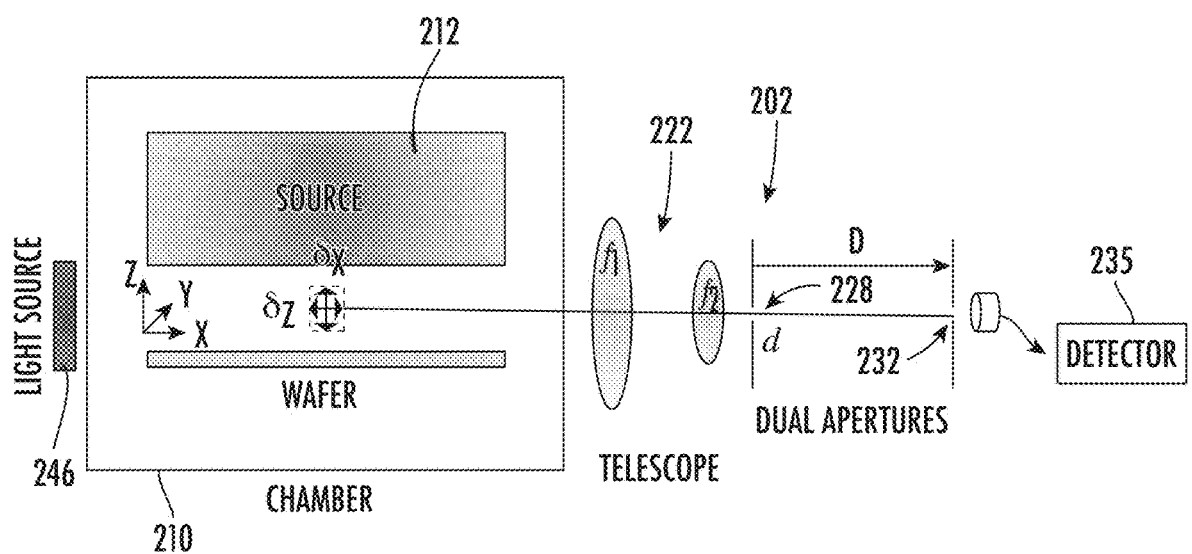
FIG. 5 is a diagram illustration addition of a narrow band light source to collect absorptive optical signals, in accordance with embodiments of the present disclosure.

Turning now to FIG. 5, an optical collection module 202 according to embodiments of the present disclosure will be described in greater detail. The optical collection module 202 may be the same or similar to the optical collection module 102 shown in FIG. 2 and described above. In the embodiment shown, the optical collection module 202 may include a light source 246 positioned external to the chamber 210. The light source 246 may be operable to deliver a light into the chamber 210 for detection by the detector 235 via the optical device 222 and the first and second apertures 228, 232.

More specifically, light from the light source 246 may be introduced from the opposite side of the imaging window to form an absorption spectroscopy setup. When the light from the light source 246 is absorbed by the particles (e.g., ions, molecules and radicals) along the light path, a shadow is cast on the detection optics. The distribution of the shadow indicates the distribution of the absorbers. In various non-limiting embodiments, the light source 246 can be a broadband classical source, or a narrow band coherent source. The latter can selectively image certain particles with transition resonant with the source frequency. Modulation can be added to the source to suppress the noise, similar to a lock-in amplifier.

Figure 6A:
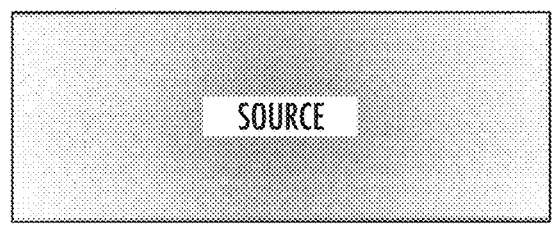
FIGS. 6A-6B depict a plurality of scans performed to produce a corresponding number of intensity curves at different z locations, in accordance with embodiments of the present disclosure.
Figure 6A:
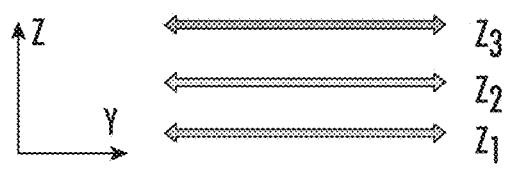
Figure 6A:
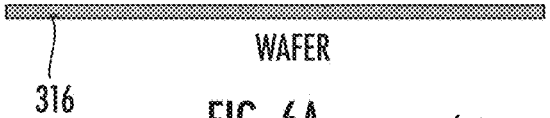
Figure 6B:
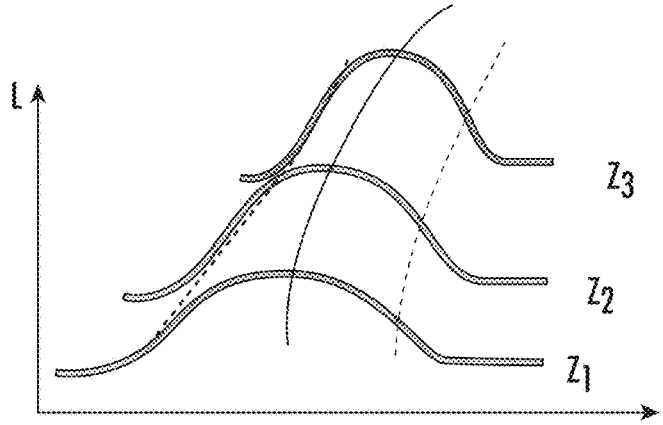

FIGS. 6A-6B depict a plurality of scans performed to produce a corresponding number of intensity curves, in accordance with embodiments of the present disclosure. With the optical intensity of selected lines and the scan coordinates, the plasma/neutral density within the chambers 110, 210 can be mapped out. For example, when scanning along the Y-direction at different Z distances (e.g., $Z_1$, $Z_2$, $Z_3$) from the wafer 316, as shown in FIG. 6A, the ion beam profile can be mapped out, as shown as $Z_1$, $Z_2$, and $Z_3$ in FIG. 6B. $Z_1$, $Z_2$, and $Z_3$ in FIG. 6B represent three intensity curves, interpolated to get beam angle and a beam spread of the ion beam. In other embodiments, when the scan is along the X-direction, the evenness of the ion beam across the wafer 316 can be mapped out. When the scan is along the Y direction, the ion beam cross section can be mapped out. In yet other embodiments, if the optical collection module is fixed, a small well confined area of the wafer is monitored.

The optical signal from the confined area can be used as a low noise signal for end-point control.

Figure 7A:
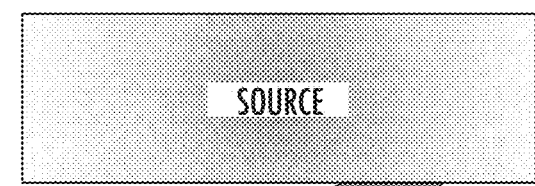
FIGS. 7A-7B demonstrate assisted beam profiling with wafer pattern, in accordance with embodiments of the present disclosure.
Figure 7A:
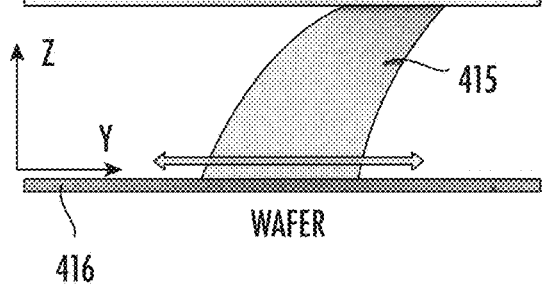
Figure 7B:
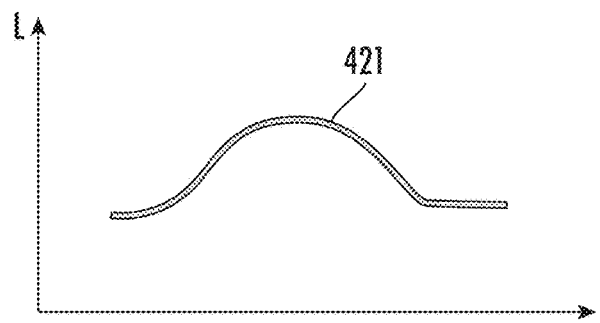

FIGS. 7A-7B demonstrate assisted beam profiling with wafer pattern, in accordance with embodiments of the present disclosure. In the non-limiting embodiment shown, a scan of the ion beam 415 may be performed along the y-direction (FIG. 7A) close to the surface 417 of the wafer 416, and then mapped to produce the intensity curve 421 shown in FIG. 7B. In some embodiments, the spatial resolution will resolve the optical intensity distribution generated by different wafer materials/beam exposures.

Figure 8:
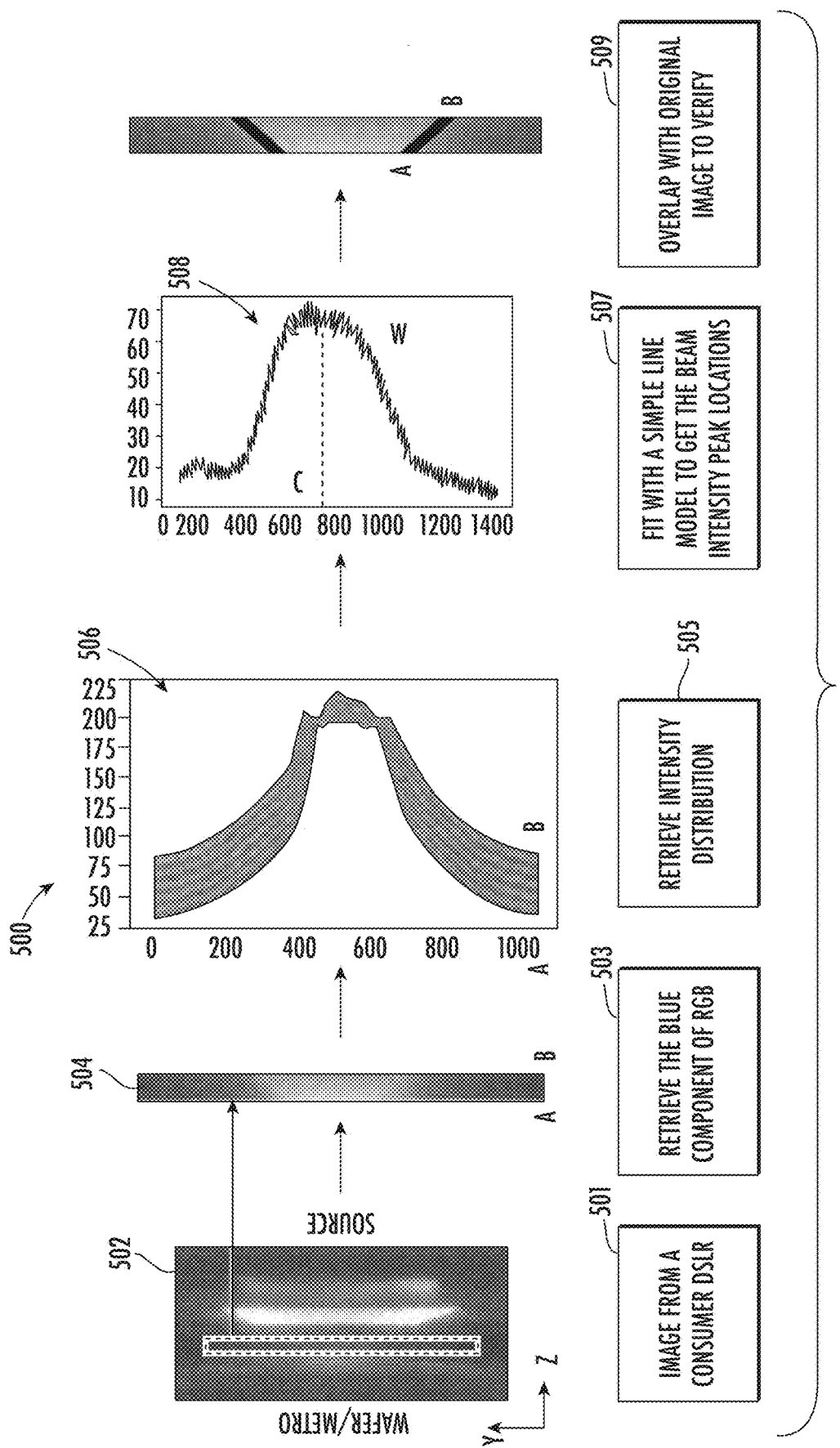
FIG. 8 demonstrates an approach for retrieving a beam profile by spatial resolved optical imaging, in accordance with embodiments of the present disclosure.

FIG. 8 demonstrates an approach 500 for retrieving a beam profile by spatial resolved optical imaging, in accordance with embodiments of the present disclosure. In a first process 501, an image 502 of an ion beam is produced, e.g., by a digital camera. In a second process 503, a slice 504 of the image 502 is processed to retrieve the blue component of RGB. In a third process 505, the blue component is mapped to retrieve an intensity distribution 506. In a fourth process 507, the intensity distribution 506 may be fit with a line model 508 to determine the beam intensity peak locations. In a fifth process 509, the line model 508 may be overlapped with the original image 502 to verify accuracy.

Figure 9:
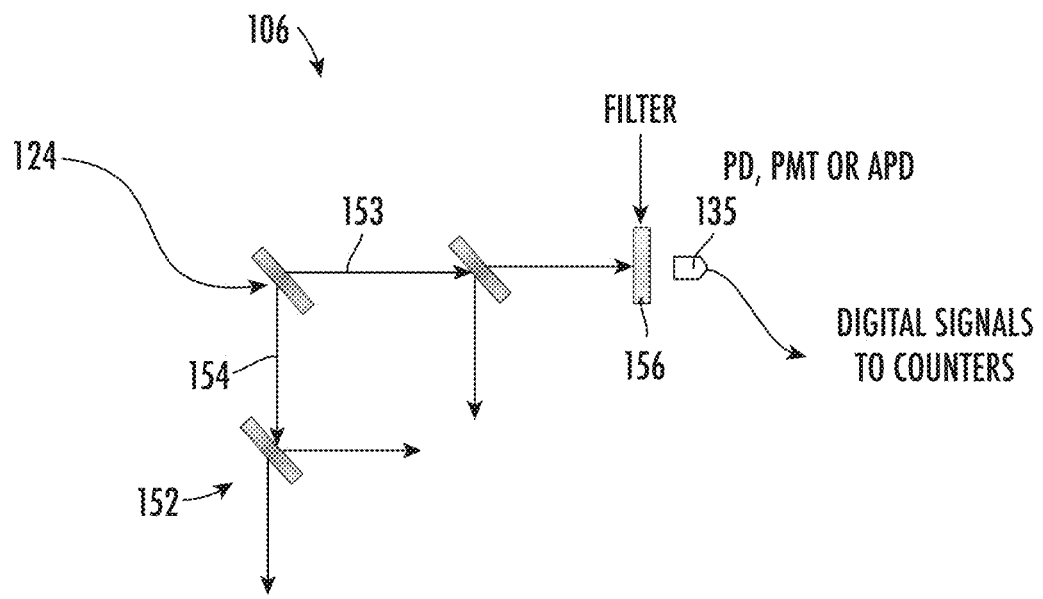
FIG. 9 is a diagram of a detection module of the system of FIG. 1, in accordance with embodiments of the present disclosure.

FIG. 9 is a diagram of the detection module 106 of the system of FIG. 1, in accordance with embodiments of the present disclosure. As shown, the detection module 106 may include a beam splitting apparatus 152 for splitting the sampled portion 124 of the ion beam 115 into a plurality of bands 153, 154. In one non-limiting embodiment, the beam splitting apparatus 152 is a plurality of dichroic mirrors used to avoid loss. The detection module 106 may further include one or more filters 156 receiving the bands 153, 154. In non-limiting embodiments, the filter 156 is a narrow band filter tapered to the spectrum. The filter 156 is used to select the interested optical signals and cut off the noise.

The detection module 106 may further include the detector 135, wherein the detector 135 is operable to receive one of the bands from the filter 156. In various non-limiting embodiments, the detector 135 may be one of: a photodiode, a photo multiplier tube, and an avalanche photo detector. The highly sensitive detector 135 may turn optical intensity into electric/digital signals 160 for further processing. In one embodiment, the electric signal 160 may be sent to either a counter or analog-to-digital converter (ADC) to be digitalized before being sent to the control module 108.

Referring again to FIG. 1, the control module 108 according to embodiments of the present disclosure will be described in greater detail. As shown, the control module 108 is operable with the optical collection module 102 and the detection module 106. In some non-limiting embodiments, the control module includes a processing device 164 operable to receive the electric signal 160 from the detection module 106. The processing device 164 is further operable to process the electric signal 160, or the digitized electric signal, to determine at least one of the following: an evenness of the ion beam 115 across the wafer 116, a cross-section of the ion beam 115, and a profile of the ion beam 115. In some embodiments, as described above, the processing device 164 may determine the profile of the ion beam by performing a plurality of scans along a first axis parallel to the surface 117 of the wafer 116, wherein each of the scans is performed at a different z-distance normal to the surface 117 of the wafer 116. The processing device may further generate a plurality of intensity curves for the plurality of scans, and then interpolate the plurality of intensity curves to determine a beam angle and a beam spread of the ion beam.

The processing device 164 may further coordinate the optical signals and the scanning module 104. The processing device 164 can either set the coordinate and read the optical signal, or simply park the scanning module 104 and constantly monitor the signal. The processing device 164 can also control the injecting light source (e.g., frequency, amplitude, or their modulations) to retrieve various information, or to increase signal noise ratio (e.g., by adding an amplitude modulation to increase SNR as similar in a lock-in amplifier). By correlating the control module 108 and the scanning module 104, comprehensive metrology data can be collected for multiple purposes etc.

Figure 10:
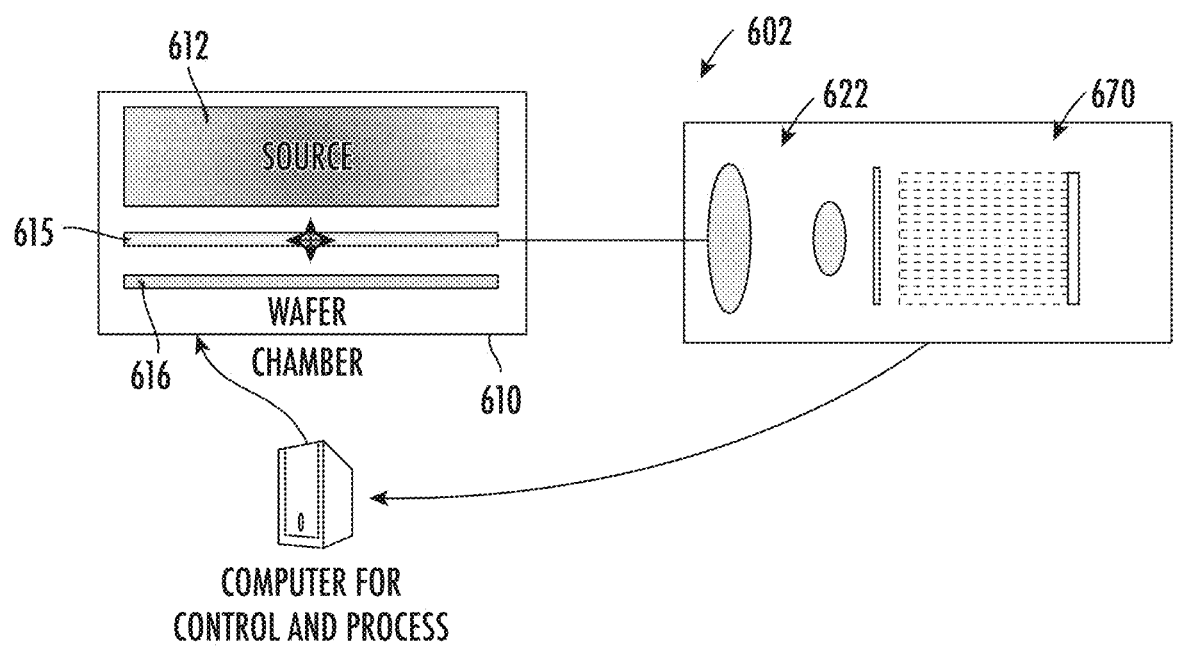
FIG. 10 is a diagram of an optical collection module based on a charge-coupled device (CCD) array or equivalent 2D image devices, in accordance with embodiments of the present disclosure.

FIG. 10 is a diagram of an alternative optical collection module 602, in accordance with embodiments of the present disclosure. As shown, the optical collection module 602 may include the chamber 610 containing the ion source 612 operable to deliver the ion beam 615 to the wafer 616. The ion beam 615 may be extracted through an extraction aperture (not shown) as a ribbon ion beam having a beam width greater than a beam height.

As shown, the optical collection module 602 is operable with the chamber 610 and may include an optical device 622 for sampling the light signals generated by a volume or portion 624 of the ion beam 615. In some embodiments, the optical device 622 is a telescope or equivalent optics. The optical collection module 602 may further include a linear array 670, such as a PMT array to replace one scan dimension, or a CCD array to replace the two-dimensional scan. In some embodiments, where a 2-D comb structure is provided in front of a CCD, or a 1-D comb structure in front of a line CCD/PMT array, the scanning structure may be partially or completely replaced (when the sensitivity allows). Omitting the mechanical scans allow faster measurement with one shot ($1 \times \tau_{exposure}$) or an one dimensional scan ($n \times \tau_{exposure}$), versus a two dimensional scan ($n \times n \times \tau_{exposure}$).

Figure 11:
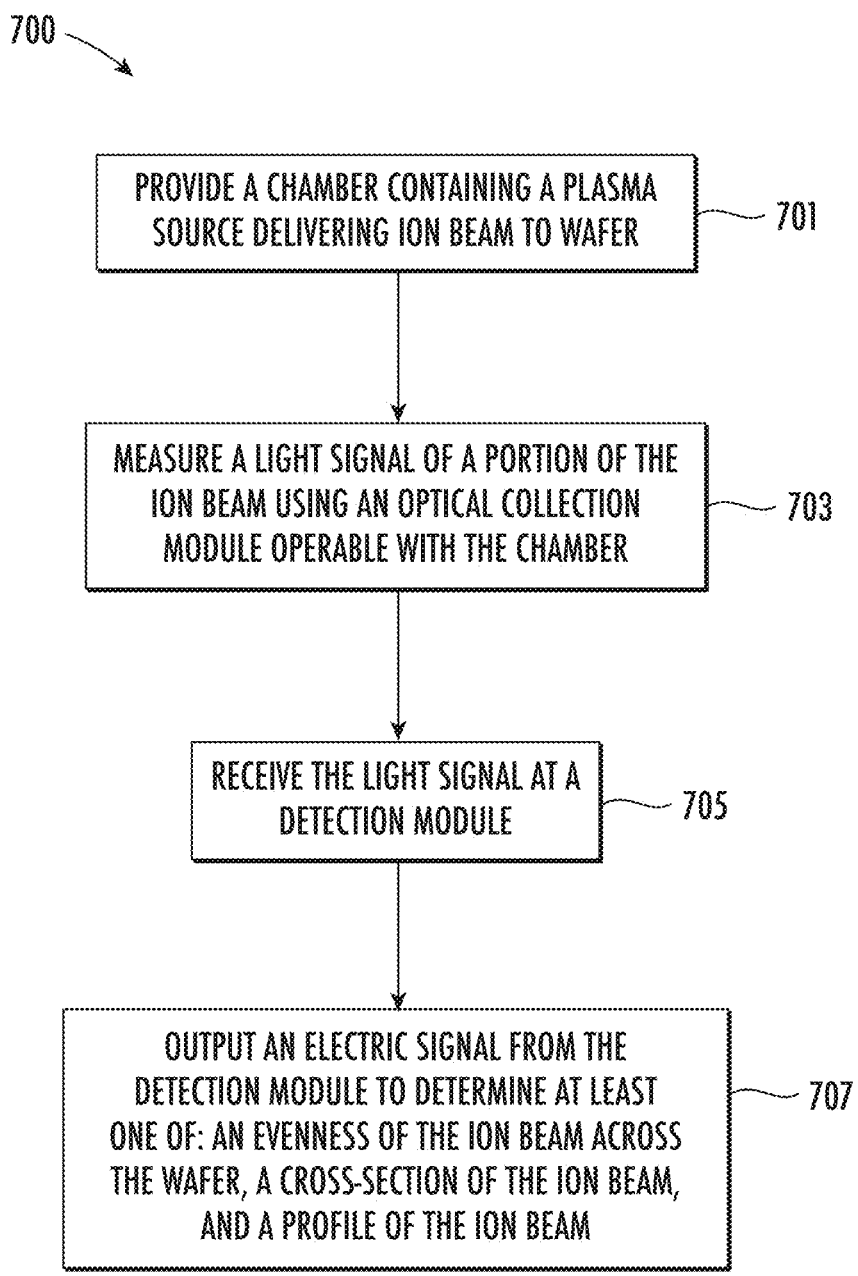
FIG. 11 is a flowchart illustrating an exemplary method according to the present disclosure The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

FIG. 11 is a flowchart illustrating an exemplary method 700 according to the present disclosure. In block 701, the method 700 may include providing a chamber containing a plasma source delivering an ion beam to a wafer. In some embodiments, the ion beam may be a ribbon ion beam. In block 703, the method 700 may include measuring a light/optical signal generated from a portion of the ion beam using an optical collection module operable with the chamber. In some embodiments, the optical collection module includes an optical device adjacent the chamber, a first plate adjacent the optical device, wherein the first plate has a first aperture receiving the light signal. The optical collection module may further include a second plate adjacent the first plate, the second plate having a second aperture receiving the light signal from the first plate.

At block 705, the method 700 may include receiving the light signal at a detection module. In some embodiments, the light signal is spatially resolved and then used to rebuild the ion beam's spatial distribution.

In some embodiments, the detection module includes at least one beam splitting apparatus for splitting the light signal of the portion of the ion beam into a plurality of bands, a filter receiving a first band of the plurality of bands, wherein the detector receives the first band of the plurality of bands from the filter.

In block 707, the method 700 may include outputting an electric signal from the detection module, the electric signal corresponding to the light signal of the portion of the ion beam. In some embodiments, the electric signal may be sent to either a counter or analog-to-digital converter (ADC) to be digitalized before being sent to the control module.

At block 709, the method 700 may include processing the electric signal to determine at least one of the following: an evenness of the ion beam across the wafer, a cross-section of the ion beam, and a profile of the ion beam. In some embodiments, the profile of the ion beam is determined by performing a plurality of scans along a first axis parallel to a surface of the wafer, wherein the plurality of scans is performed at differing distances normal to the surface of the wafer, and generating a plurality of intensity curves for the plurality of scans. The profile is further determined by interpolating the plurality of intensity curves to determine a beam angle and a beam spread of the ion beam.

In some embodiments, the method 700 may further include generating one or more optical signals of the portion of the ion beam from emissions of a plurality of excited ions and of a plurality of neutral gas molecules. The method 700 includes further monitoring at least one of the plurality of excited ions and the plurality of neutral gas molecules at a given wavelength, and mapping a density of at least one of the plurality of excited ions and the plurality of neutral gas molecules.

In some embodiments, the method 700 may further include delivering a light into the chamber for detection by the detection module, wherein the light is absorbed by the plurality of excited ions and the plurality of neutral gas molecules. A distribution of light, or lack thereof (e.g., shadows), generated on the optical device as a result of the light being absorbed by the plurality of excited ions and the plurality of neutral gas molecules may then be generated.

The foregoing discussion has been presented for purposes of illustration and description and is not intended to limit the disclosure to the form or forms disclosed herein. For example, various features of the disclosure may be grouped together in one or more aspects, embodiments, or configurations for the purpose of streamlining the disclosure. Various features of the certain aspects, embodiments, or configurations of the disclosure may be combined in alternate aspects, embodiments, or configurations. Moreover, the following claims are hereby incorporated into the Detailed Description by reference, with each claim standing alone as a separate embodiment of the present disclosure.

Embodiments herein may be computer implemented. For example, the processing device 164 may include a computer processor to perform logic operations, computational tasks, control functions, etc. In some embodiments, the computer processor may be a component of a processor. The computer processor may include one or more subsystems, components, modules, and/or other processors, and may include various logic components operable using a clock signal to latch data, advance logic states, and synchronize computations and logic operations. During operation, the computer processor may receive signals transmitted over a LAN and/or a WAN (e.g., T1, T3, 56 kb, X.25), broadband connections (ISDN, Frame Relay, ATM), wireless links (802.11, Bluetooth, etc.), and so on. In some embodiments, the signals may be encrypted using, for example, trusted key-pair encryption. Different systems may transmit information using different communication pathways, such as Ethernet or wireless networks, direct serial or parallel connections, USB, Firewire®, Bluetooth®, or other proprietary interfaces. (Firewire is a registered trademark of Apple Computer, Inc. Bluetooth is a registered trademark of Bluetooth Special Interest Group (SIG)).

In general, the computer processor executes computer program instructions or code stored in a memory unit and/or storage system. For example, when executing computer program instructions, the computer processor causes the processing device 164 to receive inputs, such as any of the optical signals parameters discussed herein, and provide, from the computer processor, the outputs.

While executing computer program code, the computer processor can read and/or write data to/from the memory unit and/or the storage system (not shown). The storage system may comprise VCRs, DVRs, RAID arrays, USB hard drives, optical disk recorders, flash storage devices, and/or any other data processing and storage elements for storing and/or processing data. Although not shown, the processing device 164 could also include I/O interfaces communicating with one or more hardware components of computer infrastructure to enable a user to interact with the processing apparatus 200 (e.g., a keyboard, a display, camera, etc.).

As used herein, an element or step recited in the singular and proceeded with the word "a" or "an" is understood as not excluding plural elements or steps, unless such exclusion is explicitly recited. Furthermore, references to "one embodiment" of the present disclosure are not intended to be interpreted as excluding the existence of additional embodiments also incorporating the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions and are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are just used for identification purposes to aid the reader's understanding of the present disclosure, and do not create limitations, particularly as to the position, orientation, or use of the disclosure. Connection references (e.g., attached, coupled, connected, and joined) are to be construed broadly and may include intermediate members between a collection of elements and relative movement between elements unless otherwise indicated. As such, connection references do not necessarily infer two elements are directly connected and in fixed relation to each other.

Furthermore, identification references (e.g., primary, secondary, first, second, third, fourth, etc.) are not intended to connote importance or priority, and are used to distinguish one feature from another. The drawings are for purposes of illustration, and the dimensions, positions, order and relative sizes reflected in the drawings attached hereto may vary.

Furthermore, the terms "substantial" or "approximately," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, although the illustrative method 700 is described above as a series of acts or events, the present disclosure is not limited by the illustrated ordering of such acts or events unless specifically stated. For example, some acts may occur in different orders and/or concurrently with other acts or events apart from those illustrated and/or described herein, in accordance with the disclosure. In addition, not all illustrated acts or events may be necessary to implement a methodology in accordance with the present disclosure. Furthermore, the method 700 may be implemented in association with the formation and/or processing of structures illustrated and described herein as well as in association with other structures not illustrated.

In view of the foregoing, at least the following technical benefits and advantages are achieved by the embodiments disclosed herein. Firstly, embodiments herein improve current tool design to fix some critical problems, such as the inaccuracy and metal contamination brought by in-vacuum beam metrology systems. Secondly, embodiments herein improve the OES process monitoring capacity, opening up potential for future advanced optical metrologies. Thirdly, the system can be easily adapted for any plasma etchers, and fast deployment can be achieved with no major modification of the existing systems, thus minimizing downtime.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A system, comprising:
   a chamber operable to deliver an ion beam;
   an optical device for measuring a light signal from a volume of the ion beam; and
   a detector for receiving the measured light signal and outputting a signal corresponding to the measured light signal.

2. The system of claim 1, further comprising a control module operable with a optical collection module and with a detection module, the control module including a processing device operable to:
   receive the signal from the detection module; and
   process the signal to determine at least one of the following: an evenness of the ion beam across a wafer, a cross-section of the ion beam, and a profile of the ion beam.

3. The system of claim 2, wherein the processing device is operable to determine the profile of the ion beam by:
   performing a plurality of scans along a first axis parallel to a surface of the wafer, the plurality of scans performed at multiple, different distances normal to the surface of the wafer;
   generating a plurality of intensity curves for the plurality of scans; and
   interpolating the plurality of intensity curves to determine a beam angle and a beam spread of the ion beam.

4. The system of claim 2, the optical collection module further comprising:
   a first plate having a first aperture receiving the measured light signal; and
   a second plate having a second aperture filtering the measured light signal through the first plate.

5. The system of claim 2, wherein the optical device is a telescope.

6. The system of claim 2, further comprising a light source positioned external to the chamber, the light source delivering a light into the chamber, wherein the light illuminates the ion beam for detection by the detection module.

7. The system of claim 2, further comprising a mechanical device operable to scan the optical collection module in multiple directions.

8. The system of claim 2, the detection module further comprising:
   at least one beam splitting apparatus for splitting the light signal into a plurality of bands;
   a filter receiving a first band of the plurality of bands; and
   the detector receiving the first band of the plurality of bands from the filter.

9. The system of claim 1, wherein the detector is one of: a photodiode, a photo multiplier tube, and an avalanche photo detector.

10. The system of claim 1, further comprising an imaging device operable to generate an image of the ion beam, wherein an intensity of the image corresponds to ion density.

11. A system for spatially resolved optical metrology of an ion beam, the system comprising:
    a chamber containing a plasma source operable to deliver an ion beam to a wafer;
    a first plate having a first aperture for receiving a measured light signal from a sample of the ion beam;
    a second plate adjacent the first plate, the second plate having a second aperture for receiving the measured light signal through the first plate; and
    a detector operable to receive the light signal from the second plate and output an electric signal corresponding to the measured light signal.

12. The system of claim 11, further comprising a control module operable with an optical collection module and with a detection module, the control module including a processing device operable to:
    receive the electric signal from the detection module; and
    process the electric signal to determine at least one of the following: an evenness of the ion beam across the wafer, a cross-section of the ion beam, and a profile of the ion beam.

13. The system of claim 12, further comprising a light source positioned on an opposite side of the chamber from the optical collection module, the light source delivering a light into the chamber, wherein the light illuminates the ion beam for detection by the detection module.

14. The system of claim 12, further comprising a mechanical device operable to scan the optical collection module in multiple directions.

15. The system of claim 12, the detection module further comprising:
    at least one beam splitting apparatus for splitting the light signal into a plurality of bands; and
    a filter receiving at least one band of the plurality of bands, wherein the detector is operable to receive the at least one band from the filter, and wherein the detector is one of: a photodiode, a photo multiplier tube, and an avalanche photo detector.

16. A method comprising:
    delivering an ion beam to a wafer;
    measuring a light signal from a portion of the ion beam by an optical device;
    receiving the measured light signal through a first aperture of a first plate, wherein the first plate is positioned adjacent the optical device;

receiving the measured light signal through a second aperture of a second plate, wherein the second plate is positioned adjacent the first plate;

receiving, at a detection module, the measured light signal from the second plate; and outputting an electric signal from the detection module, the electric signal corresponding to the measured light signal.

17. The method of claim 16, further comprising processing the electric signal to determine at least one of the following: an evenness of the ion beam across the wafer, a cross-section of the ion beam, and a profile of the ion beam.

18. The method of claim 17, wherein the profile of the ion beam is determined by:

performing a plurality of scans along a surface of the wafer at multiple, different distances normal to the surface of the wafer;

generating a plurality of intensity curves for the plurality of scans; and interpolating the plurality of intensity curves to determine at least one of: a beam angle, and a beam spread of the ion beam.

19. The method of claim 16, further comprising:

measuring the light signal of the portion of the ion beam from emissions of a plurality of excited ions and of a plurality of neutral gas molecules; and mapping a density of at least one of the plurality of excited ions and the plurality of neutral gas molecules for a given wavelength.

20. The method of claim 19, further comprising:

delivering a light into a chamber for detection by the detection module, wherein the light is absorbed by the plurality of excited ions and the plurality of neutral gas molecules; and detecting a distribution of shadows generated on the optical device as a result of the light being absorbed by the plurality of excited ions and the plurality of neutral gas molecules.

* * * * *